(12) United States Patent
Miller

(10) Patent No.: US 9,190,829 B2
(45) Date of Patent: *Nov. 17, 2015

(54) SURGE PROTECTOR

(71) Applicant: General Instrument Corporation, Horsham, PA (US)

(72) Inventor: David C. Miller, Whitehall, PA (US)

(73) Assignee: ARRIS Technology, Inc., Suwanee, GA (US)

( * ) Notice: Subject to any disclaimer, the term of this patent is extended or adjusted under 35 U.S.C. 154(b) by 183 days.

This patent is subject to a terminal disclaimer.

(21) Appl. No.: 13/863,658

(22) Filed: Apr. 16, 2013

(65) Prior Publication Data
US 2013/0321970 A1    Dec. 5, 2013

Related U.S. Application Data

(60) Provisional application No. 61/654,874, filed on Jun. 2, 2012, provisional application No. 61/802,389, filed on Mar. 16, 2013.

(51) Int. Cl.
*H02H 9/00* (2006.01)
*H02H 3/20* (2006.01)
*G06F 17/50* (2006.01)
*H02H 9/06* (2006.01)
*H04M 3/18* (2006.01)

(52) U.S. Cl.
CPC ............. *H02H 3/20* (2013.01); *G06F 17/5072* (2013.01); *H02H 9/06* (2013.01); *H04M 3/18* (2013.01)

(58) Field of Classification Search
CPC .................................................... H01L 23/552
USPC .................................................. 361/118, 120
See application file for complete search history.

(56) References Cited

U.S. PATENT DOCUMENTS

| | | | |
|---|---|---|---|
| 1,906,602 A | | 5/1933 | Hull |
| 4,616,286 A | * | 10/1986 | Breece ............................ 361/56 |
| 4,677,518 A | * | 6/1987 | Hershfield ...................... 361/56 |
| 5,151,384 A | | 9/1992 | Williams |
| 6,166,894 A | * | 12/2000 | Kane ............................. 361/119 |
| 7,245,468 B2 | * | 7/2007 | Griesbach et al. .............. 361/56 |
| 2004/0252436 A1 | | 12/2004 | Kucharski |
| 2008/0096429 A1 | | 4/2008 | Mikolajczak et al. |
| 2013/0321964 A1 | | 12/2013 | Miller |

OTHER PUBLICATIONS

Bourns, Inc., "Selection Guide: Telecom Circuit Protection", dated Nov. 2002.
EPCOS AG, "Product Profile 2009: Surge Arresters and Switching Spark Gaps", Corporate Center Edition, Ordering No. EPC:48005-7400, Germany, Aug. 2008.

\* cited by examiner

*Primary Examiner* — Stephen W Jackson
(74) *Attorney, Agent, or Firm* — Stewart M. Wiener

(57) ABSTRACT

A surge protection circuit having an open circuit voltage surge protector, such as a gas discharge tube (GDT), a closed circuit current surge protector, such as a thermistor, and a thyristor. The GDT has a breakdown voltage that is at least a first defined amount higher than an anticipated highest peak voltage. The thermistor has a series resistance associated with a series resistance of electrical equipment being protected and a breakdown voltage that is at least a second defined amount higher than an impulse voltage (voltage required to excite the GDT based on the breakdown voltage) for the GDT. The thyristor has a rated peak current at least a third defined amount greater than a peak current for the thermistor.

20 Claims, 9 Drawing Sheets

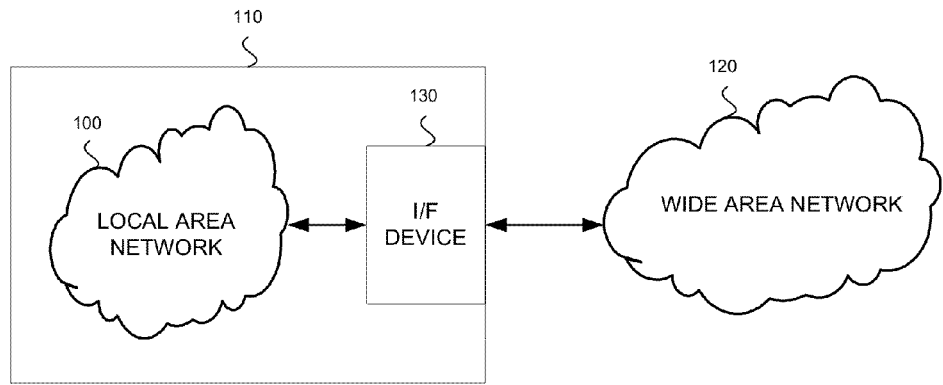
FIG. 1 *(Prior Art)*
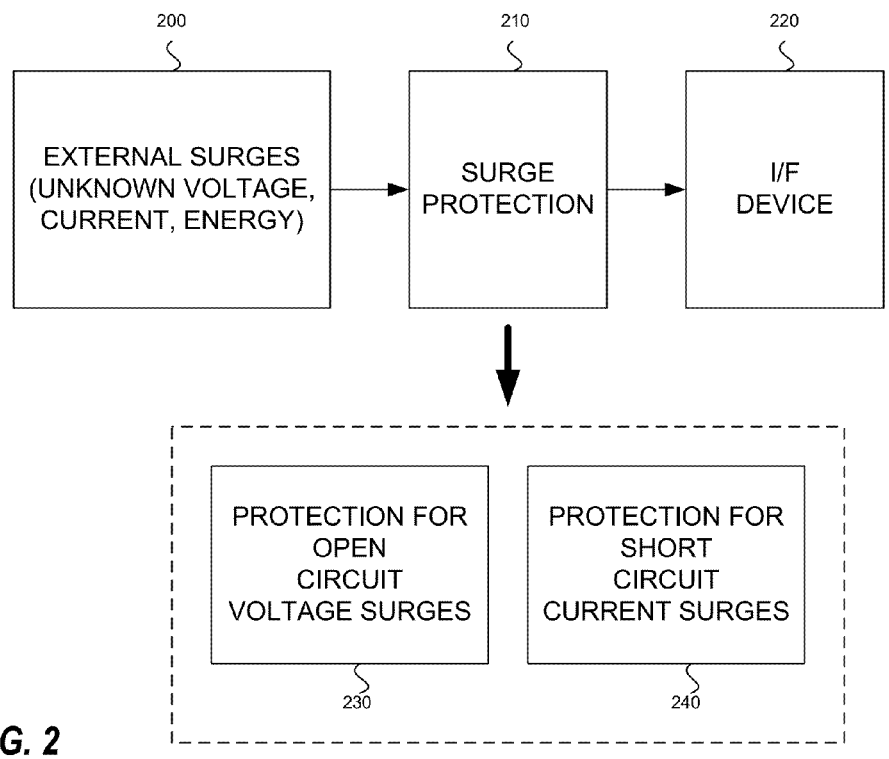
FIG. 2

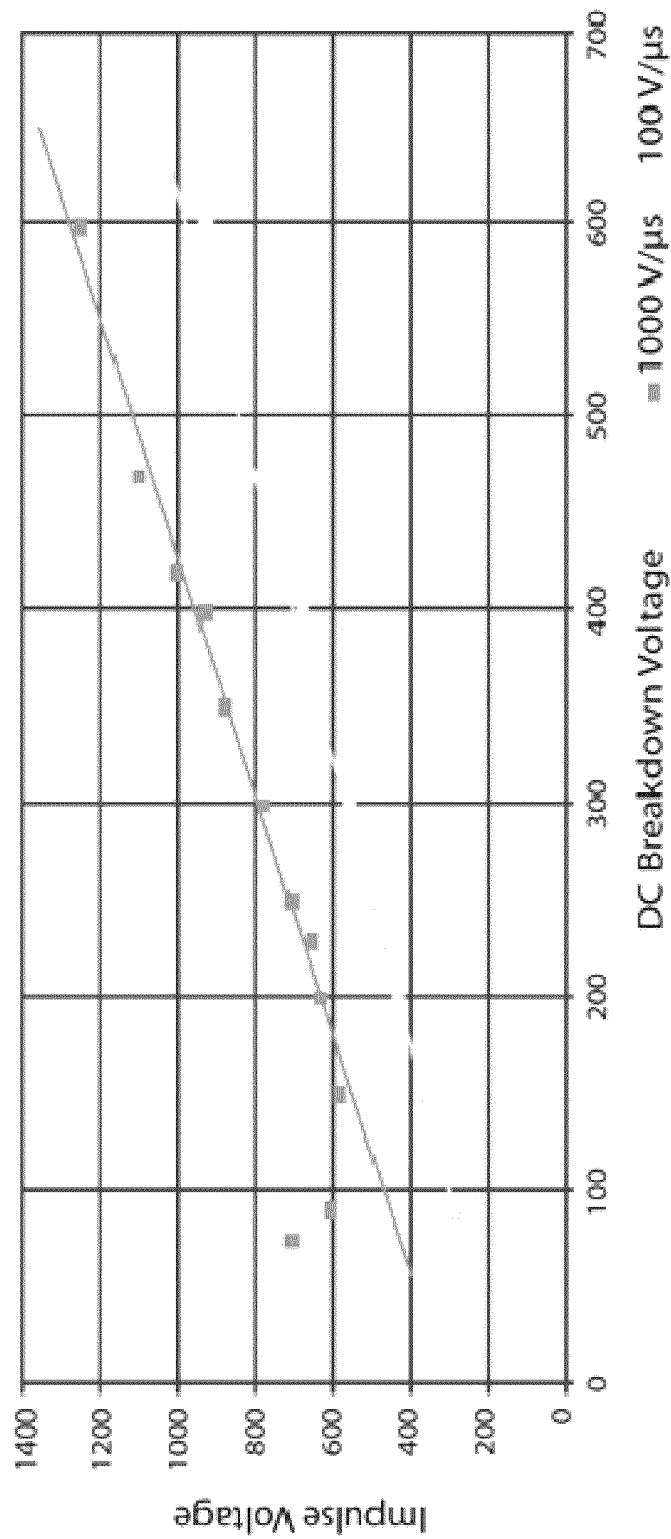
Figure 8 - GDT Impulse Voltage versus DC breakdown Voltage

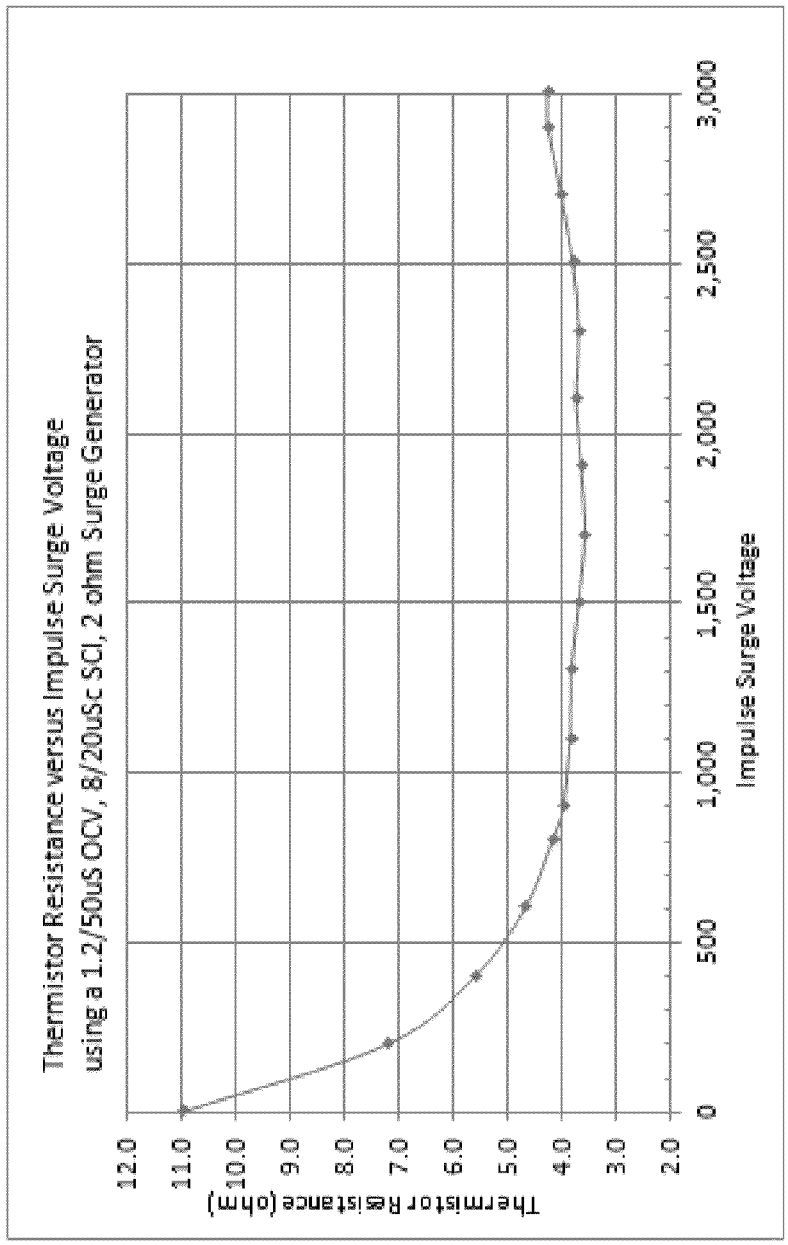
Figure 9 – Thermistor Resistance versus Impulse Surge Voltage

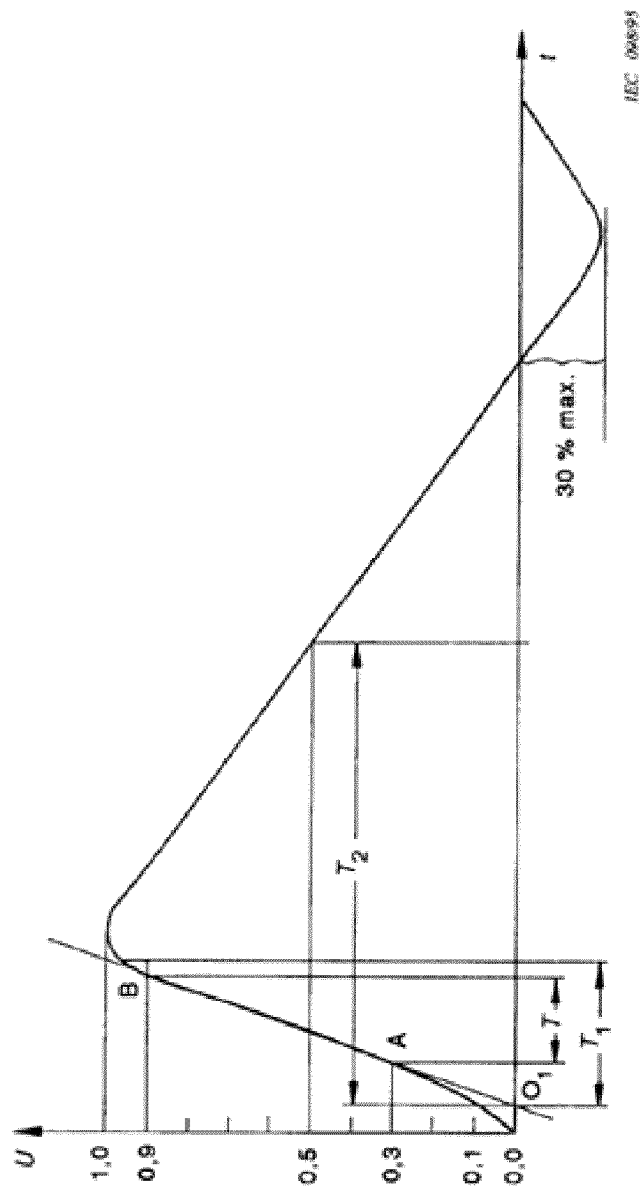
Figure 10 - Waveform of open-Circuit Voltage (1.2/50uS) (waveform definition according to IEC 60060-1)

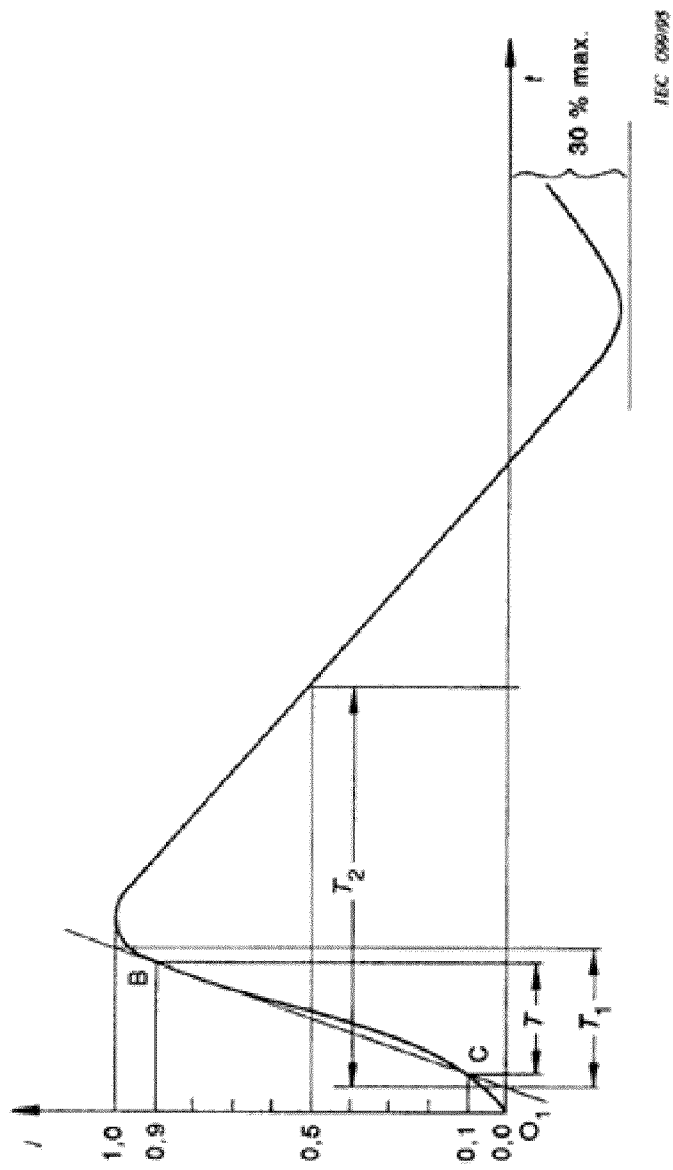
Figure 11 - Waveform of Short-Circuit Current (8/20uS) (waveform definition according to IEC 60060-1)

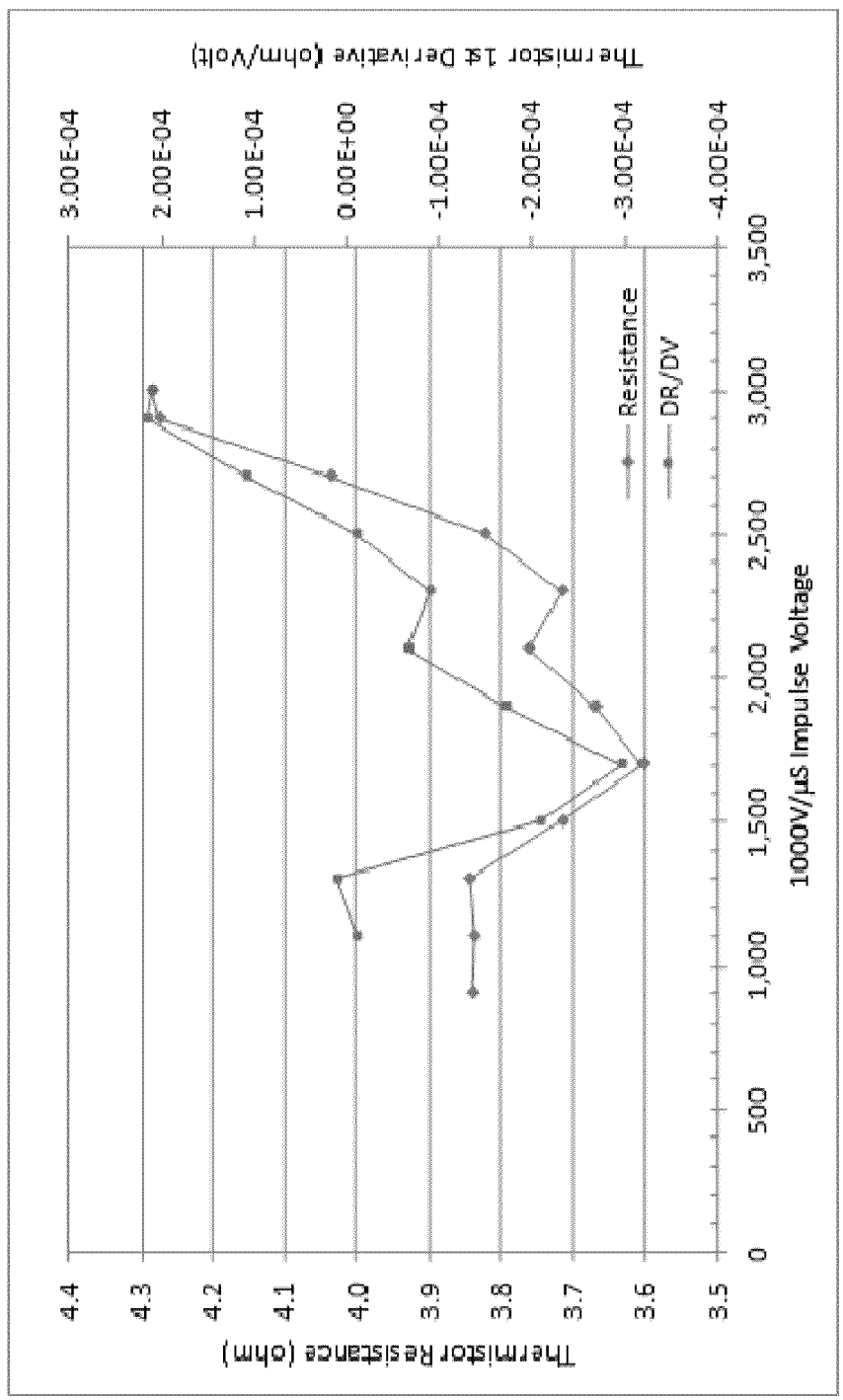
Figure 12 - Thermistor Resistance at minima versus Impulse Surge Voltage

SURGE PROTECTOR

PRIORITY

This application claims the priority under 35 USC §119 of U.S. Provisional Patent Application No. 61/654,874 filed on Jun. 2, 2012, which is herein incorporated by reference in its entirety. This application also claims the priority under 35 USC §119 of U.S. Provisional Patent Application No. 61/802,389 entitled "Surge Protector" filed on Mar. 16, 2013.

BACKGROUND

Electrical equipment is designed to operate at certain voltage and currents. The electrical equipment may be capable of handling certain spikes in voltage and/or current. The electrical equipment may include spike protection circuitry to protect against certain types of spikes (e.g., reduce, limit, remove, and/or isolate the spikes so the spikes don't reach the electronics therewithin). Furthermore external surge protection devices may be utilized to further protect the electrical devices.

The spike protection circuitry is limited in the type of protection it provides. Lightning storms may create surges that may cause damage to the electrical equipment. In areas where lightning storms are common this may produce a wide variety of surges/spikes.

FIG. 1 illustrates an example connection of a local area network (LAN) 100 within a subscriber location 110 to a wide area network (WAN) 120 via an interface device 130. The WAN 120 may be any of a various of networks including, but not limited to, a telephone network, a cable network, a digital subscriber line (DSL) network, or a satellite network. The interface device 130 may extract data from communication lines of the WAN 120 and route it to appropriate devices on the LAN 100 and may receive data from the devices on the LAN 100 and transmit them to the WAN 120 over the communications lines.

The interface device may be designed to account for spikes and certain well defined surges. However, it is possible that the interface device may encounter a variety of surges having unknown magnitude in voltage, current and energy. This may be especially true in areas that are susceptible to lightning storms and/or other WAN's that are not equipped to handle prevent/limit these surges/spikes (e.g., are not well grounded). Without proper surge protection for the interface devices they may be damaged and/or destroyed by these surges.

BRIEF DESCRIPTION OF THE DRAWINGS

The features and advantages of the various embodiments will become apparent from the following detailed description in which:

FIG. 1 illustrates an example connection of a LAN within a subscriber location to a WAN via an interface device;

FIG. 2 illustrates a block diagram showing external surges being presented and the use of surge protection to protect the interface device therefrom, according to one embodiment;

FIG. 8 plots GDT Impulse Voltage versus DC breakdown Voltage;

FIG. 9 plots the thermistor resistance versus impulse surge voltage;

FIG. 10 illustrates the impulse surge voltage waveform;

FIG. 11 illustrates the impulse surge current waveforms; and

FIG. 12 illustrates the thermistor's at minima versus impulse surge voltage.

DETAILED DESCRIPTION

Figure 3:
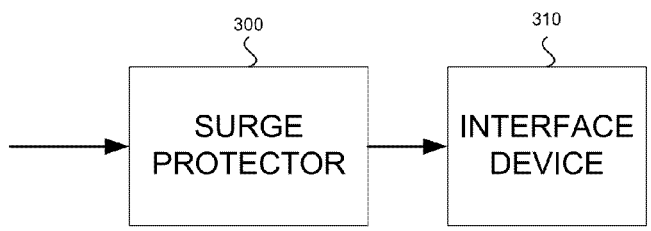
FIG. 3 illustrates a block diagram of an example surge protection circuit external to the interface device, according to one embodiment.

FIG. 2 illustrates a block diagram showing external surges 200 being presented and the use of surge protection 210 to protect an interface device 220 therefrom. The external surges 200 may be of unknown magnitude in voltage, current and energy. The surge protection 210 may be designed to provide open circuit voltage surges 230 of unknown magnitude and short circuit current surges 240 of unknown magnitude.

FIG. 3 illustrates a block diagram of an example surge protection circuit 300 external to an interface device 310.

Figure 4A:
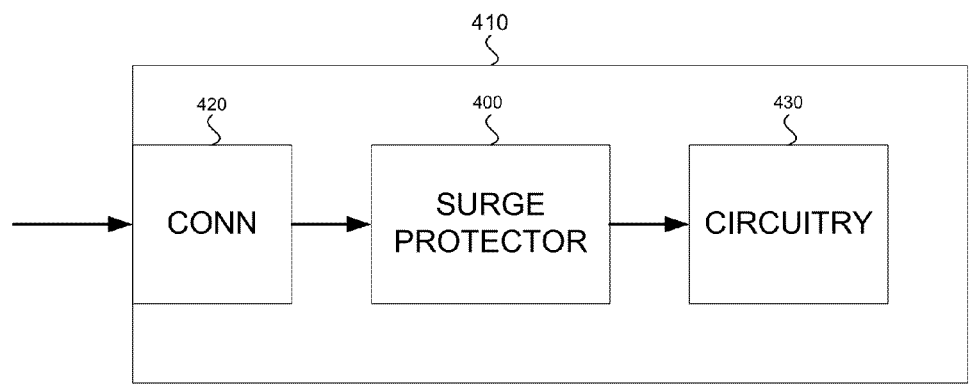
FIG. 4A-B illustrate block diagrams of example surge protection circuits internal to the interface device, according to one embodiment.
Figure 4B:
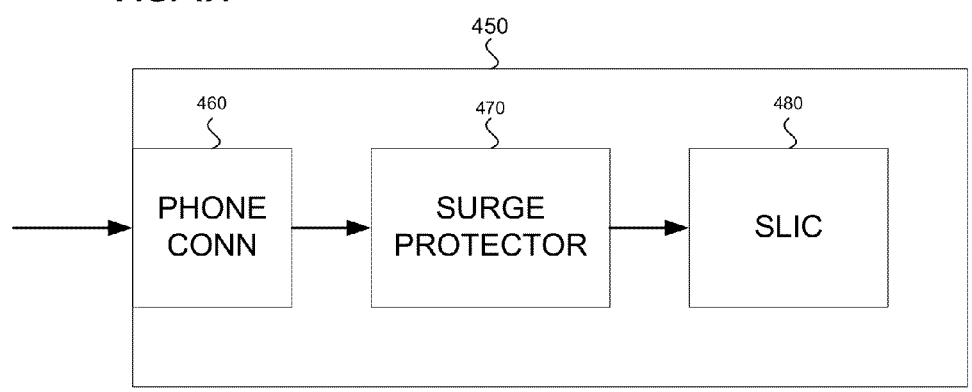

FIG. 4A illustrates a block diagram of an example surge protection circuit 400 internal to the interface device 410 (between connector 420 and internal circuitry 430). FIG. 4B illustrates a block diagram of an example interface device 450 including a phone connector 460 having surge protection 470 therewithin. The surge protection 470 is to protect a subscriber line interface card (SLIC) 480. The phone connection 460 may connect the interface device 450 to phone wire within a subscriber location. Depending on the type of interface device 450, the phone connection 460 to the internal phone lines may be on either the WAN or LAN side. For example, if the interface device 450 is utilized with a telephone network the internal phone lines are utilized to connect the interface device 450 to the phone network on WAN side. By way of another example, if the interface device 450 is utilized with a cable network the internal phone lines are utilized to connect the interface device 450 to phones on the LAN side so as to provide voice over IP service.

Figure 5:
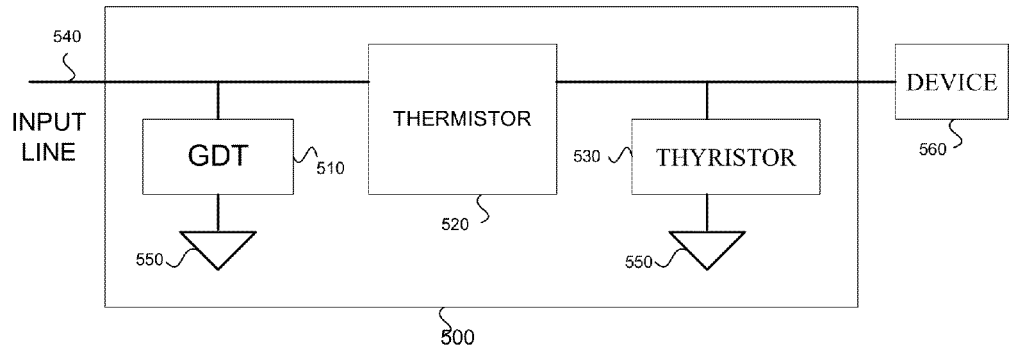
FIG. 5 illustrates an example surge protection circuit for a single wire input, according to one embodiment.

FIG. 5 illustrates an example surge protection circuit 500 according to one embodiment. The circuit 500 includes a gas discharge tube (GDT) 510, a thermistor 520 and a thyristor 530. The GDT 510 has a first side connected to an input line 540 and a second side tied to ground (the GDT shunts the input line to ground) 550. The GDT 510 is to provide surge protection against open circuit voltage surges. The GDT 510 will clamp any voltage above a certain level to that level so that the level is the maximum voltage that will be applied. In other embodiments, a different component may be utilized to provide surge protection against open circuit voltage surges. For example, a metal oxide varistor (MOV) may be substituted for a GDT.

The thermistor 520 is connected to the GDT 510 and is in series with the input line 540. The thermistor 520 is to provide surge protection against short circuit current surges. The thermistor 520 limits the current that passes therethrough as the maximum current will be based on resistance of the thermistor 520 (which may be based on resistance of interface device) at maximum voltage that it may see (from GDT). The thermistor 520 may be ceramic protective temperature coefficient (CPTC) thermistor. The thermistor 520 may be rated at approximately ten ohms to support the rating of an interface device that it is protecting (interface device can only support approximately 10 ohms of series resistance). The thermistor 520 may be an approximately 10 ohm CPTC thermistor. In further embodiments, a different component may be utilized to provide surge protection against short circuit current surges. For example, a polymer protective temperature coefficient (PPTC) thermistor, or other type of thermistor, can be substituted for a CPTC thermistor.

The thyristor 530 has a first end connected to the thermistor 520 and a second side connected to ground 550. The thyristor 530 is to clamp voltage and shunt current to provide desired voltage, current and energy to the device. The thyristor 530 is selected based on maximum voltage and current it will see and resulting output desired (based on device 560 being protected).

It should be noted that the various components illustrated as making up the surge protection circuit need not actually be contained on a single device. Rather, each of the components can be included separately, for example, within the interface device that it is providing protection for.

The example surge protection circuit of FIG. 5 is to provide surge protection for a single wire input line but is not limited thereto.

Figure 6:
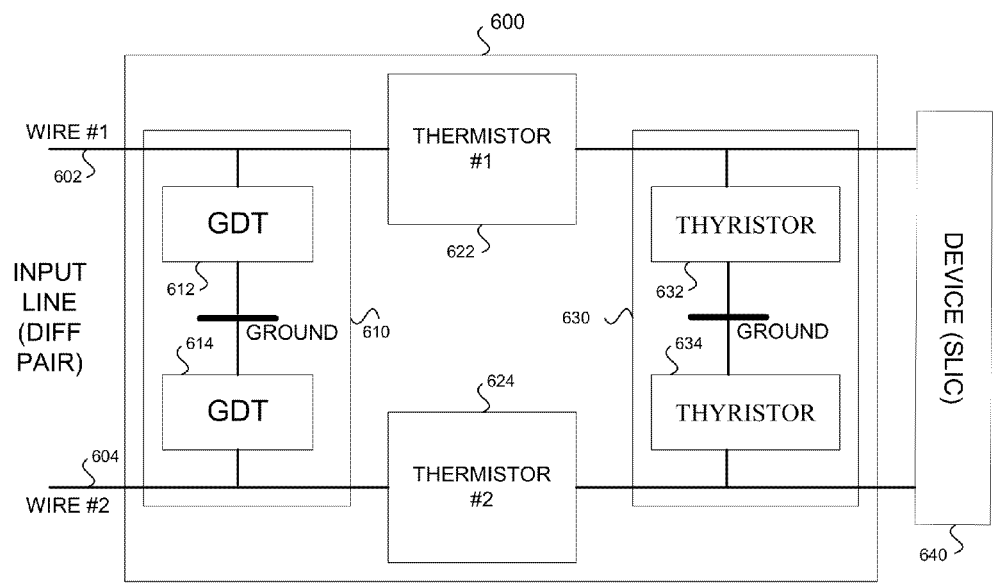
FIG. 6 illustrates an example surge protection circuit for a dual wire input, according to one embodiment.

FIG. 6 illustrates an example surge protection circuit 600 to provide surge protection to a dual wire input line (differential pair) having a first wire 602 and a second wire 604. The dual wire input may be, for example, a twisted wire pair phone line and the device being protected may be, for example, a SLIC. The surge protection circuit 600 includes a dual GDT 610, a first and second thermistor 622, 624, and a dual thyristor 630. The dual GDT 610 includes a first GDT 612 associated with the first wire 602 and a second GDT 614 associated with the second wire 604. Likewise, the dual thyristor 630 includes a first thyristor 632 associated with the first wire 602 and a second thyristor 634 associated with the second wire 604. A device 640 being protected may be, for example, a subscriber line interface card (SLIC). It should be noted that a separate GDT and/or a separate thyristor could be used for each wire.

It should be noted that while the various components making up the surge protection circuit need not actually be contained on a single device. Rather, each of the components can be included separately, for example, within the interface device that it is providing protection for.

The example surge protection circuits of FIGS. 5 and 6 include a single input line (either single wire or dual wire) but are not limited thereto. Rather the surge protection circuit could provide protection for a plurality of input lines. The input lines may include single wire input lines and/or dual wire input lines.

Figure 7:
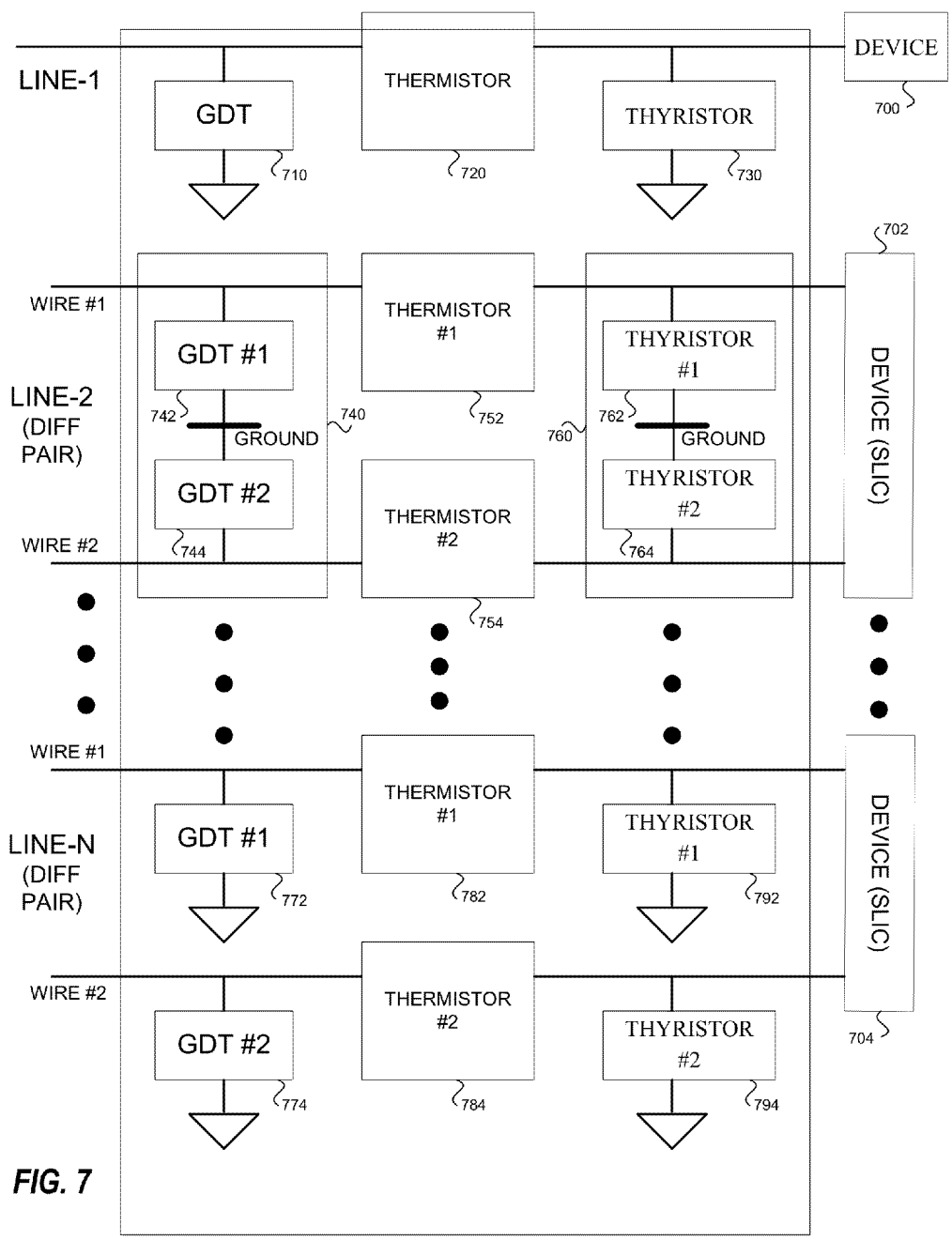
FIG. 7 illustrates an example surge protection circuit to provide surge protection to a plurality of input lines, according to one embodiment.

FIG. 7 illustrates an example surge protection circuit 700 to provide surge protection to a plurality (N) of input lines. Three input lines are illustrated in this example. A single wire input line is illustrated as Line-1, a first dual wire input line is illustrated as Line-2 and a second dual wire input line is illustrated as Line-N. The surge protection circuit 700 is in no way intended to be limited to any number or configuration of input lines.

The surge protection circuit 700 includes a GDT 710, a thermistor 720 and a thyristor 730 associated with input Line-1 to provide protection to a device 700 tied to Line-1. The surge protection circuit 700 includes a dual GDT 740 (having a first and second GDT 742, 744), a first and second thermistor 752, 754 and a dual thyristor 760 (having a first and second thyristor 762, 764), associated with input Line-2 to provide protection to a device 702 (e.g., SLIC) tied to Line-2. The surge protection circuit 700 includes a first and second GDT 772, 774, a first and second thermistor 782, 784 and a first and second thyristor 792, 794 associated with input Line-N to provide protection to a device 704 (e.g., SLIC) tied to Line-N.

The surge protection circuit 700 is not limited to the configuration illustrated. Rather, various configurations will fall within the current scope.

Surge Protection Circuit: Step-by-Step Design Process.

The components of the electrical surge protection circuit consist of a gas discharge tube (GDT), thermistor and thyristor. The step-by-step design process is detailed below. The design process identifies how to select the proper components to protect an interface device from representative 1000V/uS impulse surges. The details are described in steps 1 through 7.

Environment electrical impulse surges are a combination of a voltage wave and current wave. GR-1089-CORE, IEEEC62.41, IEC61000-4-5, ITU-T K21 and K44 recommendations, for example, recognize surges can have an impulse voltage wave with a rising edge greater than 1000V/uS. The associated impulse current wave can have a rising edge approximately 500A/uS, and the associated source resistance of the worst case surge sources are recognized to be 2 ohms.

Also, for example, a representative 1000V/uS impulse voltage wave can be characterized as having an open circuit voltage that is also at least as large as 6 kV. The surge's source resistance is approximately 2 ohms. When short circuited, the surge's 3,000 ampere peak impulse current wave delivers its full width at half maximum current in approximately 28 uS.

The surge protection circuit is a cascade of three devices. Their order is significant. The GDT is the first device in this order. The thermistor is the second device. The thyristor is the third device. In this fashion, each successive device reduces the magnitude of the impulse surge. Once the surge magnitude has been reduced by the third device, the third device's output has reduced the magnitude of the impulse surge to a level that is within the impulse surge withstand capability of the interface device.

Unlike the other two devices, the GDT has the capacity to withstand an enormous environmental electrical combination-wave impulse surge. When triggered the GDT outputs a reduced magnitude impulse surge. The thermistor that comes next after the GDT would need to be able to withstand the GDT's output impulse surge. The GDT's protection however can be automatically bypassed when the magnitude of the surge is below the GDT's trigger threshold. In these circumstances, the thermistor and the thermistor-thyristor pair would have an impulse surge withstand capability that is at least equal to the magnitude of an impulse surge that could bypass the GDT.

The thermistor protects the thyristor to an impulse surge, and the thermistor-thyristor pair protects the interface device. The voltage developed across the thermistor is the difference between the impulse surge and the trigger level of the thyristor. If the impulse surge voltage were 1563 volts and the thyristor trigger voltage were 12 volts, then 1551 volts would be developed across the thermistor. The thermistor also sets the maximum thyristor shunt current. If an impulse surge voltage across the thermistor were 1551 volts and thermistor resistance were 3.7 ohms, then the thyristor current shunt would be approximately 419 amperes. The thermistor, consequently, would need to be designed, so that its electrical performance does not degrade under the combination-wave impulse surge voltage and current.

When triggered the thyristor outputs a reduced magnitude impulse surge. Its output magnitude is specified so that the thyristor's output is within the impulse surge withstand capability of the interface device.

In the example below, the GDT clamps the 1000V/uS impulse voltage surge to approximately 1563 volts worst case. The 11 ohm thermistor resistance then limits the peak current to 419 amperes. (Thermistor resistance primarily depends on the magnitude of the impulse surge voltage applied across thermistor terminals. In this example, a 1563 impulse voltage surge lowers the thermistor's resistance to 3.7 ohms.) When the thermistor-limited impulse surge current reaches the thyristor, the thyristor shunts that impulse surge current and shorts the impulse surge voltage to ground. The voltage-short developed across the thyristor is typically less than 12 volts.

Each device in the cascade (GDT, thermistor, thyristor) as illustrated above is operated within its impulse surge limits. The GDT first reduces the magnitude of the impulse surge to a level within the thermistor's known operating voltage, current and energy limits. The thermistor then reduces combination-wave impulse surge voltage and current to a level within the thyristor's known operating voltage, current and energy limits. The thyristor, then, when operated within its known limits of voltage, current and energy ensures the interface device experiences the impulse surge disturbance within its own known limits of voltage, current and energy. The following Design Process will demonstrate this.

1000V/uS Impulse Sparkover Voltage:

(1) Determine the highest peak voltage at the input to the surge protection circuit that could be applied for at least 1 second at 200 amperes. For example, a 277 Vac, 60 Hz power line signal that is applied for 15 minutes has a 392 voltage peak.

(2) Select the GDT, which has as its DC breakdown voltage, a voltage that is greater than the peak voltage can be applied across the GDT for duration of at least 1 second at 200 ampere. The GDT should not be energized by this peak voltage that is present for this duration. In this example, the GDT has a 600 volt DC breakdown voltage. A voltage of 600 volts is 35% higher than 392 volts.

For example, FIG. 8 plots the GDT Impulse Sparkover Voltage versus DC breakdown Voltage. The dots plotted on the curves are those GDT's that suppliers manufacture and are available for purchase. Notice that a GDT with a 600 volt DC breakdown voltage is available from the supplier. This 600 volt DC breakdown voltage value, however, has as a 20% tolerance, according to this manufacturer. Eighty percent (80%) of 600 volts is 480 volts. Consequently, the selected GDT with the 600 volt DC breakdown voltage has an 18 percent DC breakdown voltage margin with respect to the 392 peak volts. FIG. 8 was copied from white paper written by Tim Ardley titled 'First Principles of a Gas Discharge Tube (GDT) Primary Protector,' Revision 2.

(3) The thermistor resistance, in this example, is 11.00 ohm, at 100 mV-dc, at a +25 Celsius lead temperature. FIG. 9 below plots the thermistor resistance versus impulse surge voltage. The source of the combination-wave impulse surge is an impulse surge generator that has a 2 ohm source resistance. Its combination-wave is characterized by a 1.2/50 uS open-circuit voltage (OCV) and by an 8/20 uS short-circuit current (SCI). The impulse surge voltage and impulse surge current waveforms are illustrated in FIG. 10 and FIG. 11, respectively. The actual impulse surge waveform that is delivered by the generator depends on the generator and the impedance of the actual thermistor under test.

The source for FIG. 10 and FIG. 11 is page 43 of the International Electromechanical Commission's International Standard, IEC 61000-4-5, Edition 1.1, 2001-04, titled, "Electromagnetic compatibility (EMC) Part 4-5: Testing and measurement techniques-Surge immunity test." These figures were provided by IHS Licensee=Motorola/9999927101, Copyright 2003; International Electrotechnical Commission.

(4) Another criteria, in order for the surge protection circuit to operate properly, is that the thermistor impulse voltage breakdown exceeds the worst case maximum impulse sparkover voltage of the GDT. The thermistor impulse breakdown voltage will vary from device-to-device, when comparing the same device from one device to another device, and when comparing one manufacturing lot of the same device to another manufacturing lot of the same device. This is inherent in the design and manufacture of a thermistor. A 5 percent margin ensures the thermistor's impulse breakdown voltage exceeds the GDT's maximum 1000V/uS impulse sparkover voltage. However, a narrower or higher percentage margin is acceptable, so long as the thermistor's impulse breakdown voltage exceeds the maximum GDT impulse sparkover voltage. In this example, a thermistor is selected that has an impulse breakdown voltage 1.08 times higher than the GDT's 1000V/uS impulse sparkover voltage.

For example, in FIG. 8, the GDT with the 600 volt DC breakdown voltage has a 1000V/uS impulse sparkover voltage of approximately 1250 volts. According to the GDT manufacturer, the 1000V/uS impulse sparkover voltage has a 25% tolerance. In other words, the GDT's 1000V/uS impulse sparkover voltage could be 1563 volts. In FIG. 12 the selected thermistor has a 1700 volt impulse surge breakdown voltage. The thermistor's impulse surge breakdown voltage occurs at the inflection point of the minima in thermistor resistance. The thermistor's 1700 volt impulse breakdown exceeds the 1563 volt GDT impulse sparkover voltage. In this example, the thermistor has a 8 percent impulse surge voltage margin.

To determine the thermistor's impulse breakdown voltage measure the thermistor's resistance as a function of the combination-wave impulse surge voltage and the 28 uS full width at half maximum impulse surge current applied across the thermistor. Start the measurement at a voltage several hundred volts below the GDT's rated 1000V/uS impulse voltage. Increment the test voltage in 200 volt steps, for instance. The last test voltage level should be above the inflection point of the thermistor resistance's minima. The thermistor's impulse breakdown voltage occurs at the inflection point of the resistance minima, as illustrated in FIG. 12.

The test equipment set-up used in this example to determine the thermistor's resistance as a function of an impulse surge voltage was defined by the International Electromechanical Commission's International Standard, IEC 61000-4-5, Edition 1.1, 2001-04, titled, "Electromagnetic compatibility (EMC) Part 4-5: Testing and measurement techniques-Surge immunity test." Section 6.1 defined the Combination Wave (hybrid) generator (1.2/50 us-8/20 us). The generator delivers a 1.2/50 us voltage surge into an open-circuit and a 8/20 us current surge into a short circuit. The generator has an effective output impedance of 2 ohms. Other test equipment set-ups are permitted, in order to tailor the thermistor measurement to the specific end-use environment.

(5) Record the thermistor's resistance at the GDT's 1000V/uS impulse voltage. From FIG. 12, for this example, the thermistor's resistance is approximately 3.7 ohms at 1563 volts.

(6) Compute the thermistor's worst case impulse surge current. That is, divide the GDT's worst case 1000V/uS impulse voltage by the thermistor's resistance at this voltage. GDT's worst case 1000V/uS impulse voltage is 1563 volts. The thermistor's current is 422 amperes. That is, 422 amperes equals 1563 volts divided by 3.7 ohms.

(7) Another criteria, in order for the Surge Protection Apparatus will operate properly, is to select an appropriate thyristor. The thermistor sets the maximum current to be shunted by the thyristor. That is, the peak impulse current shunted by the thyristor should not exceed the thyristor's rated peak impulse current.

The impulse surge current shunted by the thyristor can be computed by dividing the GDT's impulse sparkover voltage by the corresponding thermistor impulse surge resistance. The value computed earlier for the peak impulse current was 422 amperes. (The value is expected to be 419 amperes, if the thyristor's 12 volt voltage shunt is also taken into account.) A suitable thyristor would be the Bourns part number TISP61089HDMR. The thyristor's rated peak impulse current is 500 amperes for a 8/20 uS impulse current. In this example, the thyristor has a rated peak impulse current approximately 15% percent greater than the actual peak impulse current that will be shunted by the thyristor. A narrower or higher percentage margin is acceptable, so long as the thyristor's rated peak impulse current exceeds the actual peak impulse current. In this example, a thyristor is selected that has a rated 28 uS full width at half maximum peak impulse current 1.15 times higher than the actual 28 uS full width at half maximum peak impulse current.

At the moment the thyristor shunts the impulse surge current to ground, a voltage short develops across the thyristor. The voltage short is typically less than 12 volts. The interface device must be rated to withstand the voltage short that is developed across the thyristor.

In summary, when an electrical impulse surge reaches a voltage level that triggers the GDT to sparkover, the GDT will transition through its glow region and operate in its arc region. In the arc region, the GDT shorts the impulse surge voltage wave and shunts the impulse surge current wave. As mentioned above, the thermistor's resistance protects the thyristor, while the thermistor-thyristor pair protects the interface device.

The voltage short developed across the GDT during its current shunt is typically less than 15 volts. While the GDT shunts the impulse surge current, the interface device must be rated to withstand the voltage developed across the GDT, impulse current that passes through the thermistor as well as the voltage short developed across the thyristor.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed is:

1. A method for selecting appropriate components for a surge protection circuit providing surge protection for a device, the method comprising:
   determining a highest peak voltage at input to the surge protector;
   selecting a gas discharge tube (GDT) having a first breakdown voltage greater than the anticipated highest peak voltage;
   determining an impulse voltage for the GDT, wherein the impulse voltage is the voltage required to excite the GDT based on the GDT's breakdown voltage;
   selecting a thermistor having a second breakdown voltage greater than an impulse voltage for the GDT;
   determining resistance of the thermistor at the impulse voltage for the GDT;
   computing an anticipated peak current of the thermistor, wherein the anticipated peak current is based on the impulse voltage for the GDT and resistance of the thermistor; and
   selecting a thyristor having a rated peak current greater than the anticipated peak current for the thermistor.

2. The method of claim 1, wherein the selecting a thermistor includes selecting the thermistor having a serial resistance of approximately 10 ohms.

3. The method of claim 1, wherein the selecting a thermistor includes selecting a ceramic protective temperature coefficient (CPTC) thermistor.

4. The method of claim 1, wherein the selecting a thermistor includes selecting a polymer protective temperature coefficient (PPTC).

5. The method of claim 1, wherein the selecting a GDT, the selecting a thermistor, and the selecting a thyristor are based on a surge having a 1000 V/µs impulse voltage shape.

6. The method of claim 1, further comprising providing the surge protection circuit having the GDT, the thermistor and the thyristor.

7. The method of claim 1, further comprising providing a circuit diagram for the surge protection circuit.

8. A surge protection circuit configured in accordance with the method of claim 1.

9. A surge protection circuit for electrical equipment comprising:
   a gas discharge tube (GDT) having a first breakdown voltage greater than an anticipated highest peak voltage;
   a thermistor having a serial resistance of approximately 10 ohms and a second breakdown voltage greater than an impulse voltage for the GDT, wherein the impulse voltage is voltage required to excite the GDT based on the first breakdown voltage; and
   a thyristor having a rated peak current greater than an anticipated peak current for the thermistor.

10. The surge protection circuit of claim 9, wherein the thermistor has a serial resistance of approximately 10 ohms.

11. The surge protection circuit of claim 9, wherein the thermistor is a ceramic protective temperature coefficient (CPTC) thermistor.

12. The surge protection circuit of claim 9, wherein the thermistor is a polymer protective temperature coefficient (PPTC).

13. The surge protection circuit of claim 9, configured to handle a surge having a 1000 V/µs impulse voltage shape.

14. An interface device comprising:
   a connector to receive an input line;
   circuitry configured to receive the input line; and
   a surge protection circuit configured between the input line and the circuitry to protect the circuitry from external surges may be of unknown magnitude in voltage, current and energy, wherein the surge protection circuit includes
   a gas discharge tube (GDT) having a first breakdown voltage greater than an anticipated highest peak voltage for the interface device;
   a ceramic protective temperature coefficient (CPTC) thermistor having a second breakdown voltage greater than an impulse voltage for the GDT, and wherein the impulse voltage is voltage required to excite the GDT based on the first breakdown voltage; and
   a thyristor having a rated peak current greater than an anticipated peak current for the CPTC thermistor.

15. The interface device of claim 14, wherein the series resistance of the CPTC thermistor is approximately 10 ohms.

16. The interface device of claim 14, wherein the circuitry is a subscriber line interface card (SLIC).

17. The interface device of claim 14, wherein the input line is a dual wire input line, wherein the surge protection circuit includes a first GDT, a first CPTC thermistor, and a first thyristor associated with a first wire of the dual wire input line, and a second GDT, a second CPTC thermistor, and a second thyristor associated with a second wire of the dual wire input line.

18. The interface device of claim 14, wherein the input line is a dual wire input line, and wherein the surge protection circuit includes a dual GDT having a first GDT associated with a first wire of the dual wire input line and a second GDT associated with a second wire of the dual wire input line, a first CPTC thermistor associated with the first wire and a second CPTC thermistor associated with the second wire, and a dual thyristor having a first thyristor associated with the first wire and a second thyristor associated with the second wire.

19. The interface device of claim 14, further comprising
   additional connectors to receive additional input lines; and
   additional surge protection circuits configured between the additional input lines and the circuitry.

20. The interface device of claim 14, wherein the surge protection circuit is configured to handle a surge having a 1000 V/μs impulse voltage shape.

\* \* \* \* \*